(12) United States Patent
Kim et al.

(10) Patent No.: US 9,349,456 B2
(45) Date of Patent: May 24, 2016

(54) METHOD OF OPERATING NON-VOLATILE MEMORY DEVICE

(75) Inventors: Se Jun Kim, Gyeonggi-do (KR); Hea Jong Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 990 days.

(21) Appl. No.: 13/483,521

(22) Filed: May 30, 2012

(65) Prior Publication Data

US 2012/0307567 A1    Dec. 6, 2012

(30) Foreign Application Priority Data

Jun. 1, 2011    (KR) .................. 10-2011-0052725

(51) Int. Cl.
| | | |
|---|---|---|
| *G11C 16/06* | (2006.01) | |
| *G11C 16/34* | (2006.01) | |
| *G11C 16/16* | (2006.01) | |
| *G11C 16/04* | (2006.01) | |

(52) U.S. Cl.
    CPC ............ *G11C 16/06* (2013.01); *G11C 16/0483* (2013.01); *G11C 16/16* (2013.01); *G11C 16/3409* (2013.01)

(58) Field of Classification Search
    CPC ...... G11C 16/28; G11C 16/26; G11C 7/1021; G11C 16/0491; G11C 16/32; G11C 16/3445; G11C 2207/2281; G11C 7/22; G11C 16/10
    USPC ........................ 365/185.25, 185.29
    See application file for complete search history.

(56) References Cited

U.S. PATENT DOCUMENTS

| | | | |
|---|---|---|---|
| 6,597,609 B2 * | 7/2003 | Chevallier ...................... 365/201 |
| 7,929,351 B2 * | 4/2011 | Seol et al. ................ 365/185.22 |
| 2007/0002625 A1 * | 1/2007 | Park ......................... 365/185.12 |
| 2007/0183220 A1 * | 8/2007 | Aritome .................... 365/185.29 |
| 2007/0247928 A1 * | 10/2007 | Park ......................... 365/189.05 |
| 2009/0168544 A1 * | 7/2009 | Jeon ......................... 365/185.29 |
| 2010/0214839 A1 * | 8/2010 | Guzzi ............... G11C 16/0483 365/185.17 |
| 2012/0307565 A1 * | 12/2012 | Aritome .................... 365/185.22 |

FOREIGN PATENT DOCUMENTS

| | | |
|---|---|---|
| KR | 1020090091691 | 8/2009 |
| KR | 100932367 | 12/2009 |

OTHER PUBLICATIONS

Notice of Allowance issued by the Korean Intellectual Property Office on Feb. 21, 2013.

* cited by examiner

*Primary Examiner* — Hien Nguyen
(74) *Attorney, Agent, or Firm* — IP & T Group LLP

(57) ABSTRACT

A method of operating a non-volatile memory device includes erasing a memory cell block, supplying a first drain turn-on voltage higher than a target level to the drain select line of the memory cell block, and performing a soft program operation by supplying a soft program voltage to the word lines of the memory cell block.

18 Claims, 8 Drawing Sheets

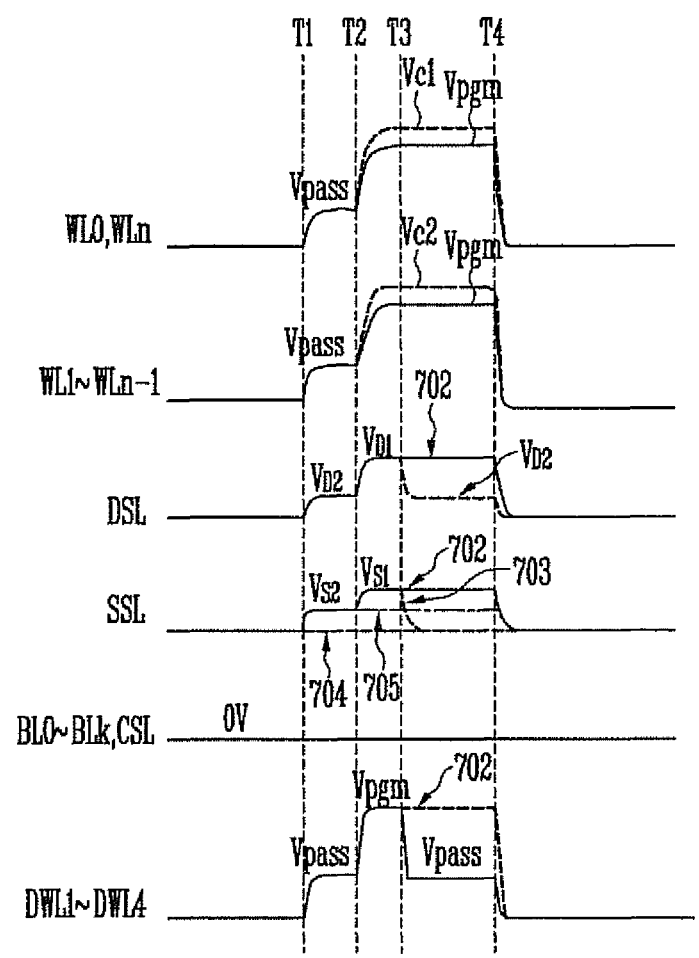

METHOD OF OPERATING NON-VOLATILE MEMORY DEVICE

CROSS-REFERENCE TO RELATED APPLICATION

Priority to Korean patent application number 10-2011-0052725 filed on Jun. 1, 2011, the entire disclosure of which is incorporated by reference herein, is claimed.

BACKGROUND

Embodiments of this disclosure relate to methods of operating a non-volatile memory device and, more particularly, to soft program methods.

The program operation of a non-volatile memory device is performed after all of the memory cells of a selected memory cell block are erased. After all of the memory cells of the selected memory cell block are erased, a distribution of the threshold voltages of the erased memory cells becomes widened because a plurality of memory cells is included in the selected memory cell block. As the threshold voltages of memory cells having an erase state are lowered, the time that it takes to perform a program operation increases and the level of a program voltage rises.

In order to address such features, after an erase operation is performed on a selected memory cell block, a program operation for raising the threshold voltages of memory cells is performed. This method is called a soft program method.

A soft program operation is performed by supplying 0 V to all of the bit lines coupled to an erased memory cell block (that is, a selected memory cell block) and supplying a program voltage to all of the word lines coupled to the erased memory cell block. Since the program voltage is supplied to all of the word lines coupled to the selected memory cell block as described above, the substantial levels of a voltage supplied to the word lines may be different because of an increase in capacitive coupling between adjacent word lines.

FIGS. 1 and 2 are diagrams illustrating a conventional memory program method.

Referring to FIG. 1, a non-volatile memory device includes a memory cell block 10 in which data is stored. The memory cell block 10 includes a plurality of cell strings ST. Each of the cell strings ST includes a drain select transistor DST, a source select transistor SST, and a plurality of memory cells F0 to Fn coupled in series between the drain select transistor DST and the source select transistor SST. The drains of the drain select transistors DST included in the respective cell strings are coupled to respective bit lines BL0 to $BL_k$, and the sources of the source select transistors SST included in the respective cell strings are coupled to a common source line CSL. The gates of the drain select transistors DST belonging to the different strings ST are coupled to form part of a drain select line DSL, and the gates of the source select transistors SST belonging to the different strings ST are coupled to form part of a source select line SSL. Furthermore, the gates of the memory cells F0 to Fn belonging to the different strings ST are coupled to form respective word lines WL0 to WLn.

In order for the non-volatile memory device to perform a program operation, a memory cell block to be programmed is first selected, and all of the memory cells F0 to Fn included in the selected memory cell block are erased. After all of the memory cells are erased, the threshold voltages of the memory cells having an erase state become low because a plurality of the memory cells is included in a single memory cell block. More specifically, if the threshold voltages of all of the memory cells within the selected memory cell block are erased with a level lower than 0 V, the threshold voltages of memory cells on which the erase operation is performed in the early stage become lower than those of other memory cells. As the threshold voltages all the of memory cells having an erase state become low as described above, the time that it takes to perform a program operation in order to raise the lowered threshold voltages to a target level is increased.

In order to address such a feature, after an erase operation is performed on a selected memory cell block, a soft program operation for raising the threshold voltages of memory cells, included in the selected memory cell block, to an erase level or lower is performed. The soft program operation is similar to a program operation but is different from the program operation in that all of the memory cells of the selected memory cell block are programmed at the same time so that they have a target level lower than 0 V.

Here, in order to program all of the memory cells F0 to Fn at the same time, a program voltage is supplied to all of the word lines WL0 to WLn coupled to the selected memory cell block in the soft program operation so that the threshold voltages of the memory cells F0 to Fn are raised. If the program voltage is supplied to all of the word lines WL0 to WLn as described above, capacitance Ca and capacitance Cb are generated between the word lines adjacent to each other within the same cell string ST, with the result that the program voltage Vpgm rises. However, since a voltage lower than the program voltage Vpgm is supplied to the drain and source select lines DSL and SSL of the cell string ST during the soft program operation, the word lines WL0 and WLn adjacent to the drain and source select lines DSL and SSL have the capacitance Cb lower than the capacitance Ca between the remaining word lines WL1 to WLn−1. Accordingly, an electric potential of the word lines WL0 and WLn adjacent to the drain and source select lines DSL and SSL is lower than that of the remaining word lines WL1 to WLn−1.

Referring to FIG. 2, if the electric potential of the word lines WL0 and WLn coupled to the edges of the string ST is lower than that of the remaining word lines WL1 to WLn−1 as described above in the soft program operation, the threshold voltages 20a of the memory cells F0 and Fn coupled to the respective word lines W0 and WLn are lower than those of the remaining memory cells F1 to Fn−1. In this case, although the soft program operation is performed after the erase operation, an increment of the threshold voltages of the memory cells F1 and Fn coupled to the edges of the string is low, with the result that an overall distribution We of the threshold voltages is still wide. This makes it difficult to efficiently reduce the time taken to perform a subsequent program operation.

BRIEF SUMMARY

In accordance with exemplary embodiments of this disclosure, the threshold voltages of memory cells having an erase state may be efficiently raised by reducing a difference in the potential between word lines in a soft program operation subsequent to an erase operation.

A method of operating a non-volatile memory device according to an aspect of the present disclosure includes erasing a memory cell block; supplying a first drain turn-on voltage higher than a target level to the drain select line of the memory cell block; and performing a soft program operation by supplying a soft program voltage to the word lines of the memory cell block.

A method of operating a non-volatile memory device according to another aspect of the present disclosure includes erasing a memory cell block; supplying a turn-on voltage having a target level to the drain select line of the memory cell block and supplying a program pass voltage to the word lines of the memory cell block; and performing a soft program operation by supplying a first drain turn-on voltage higher than the target level to the drain select line and supplying the soft program voltage to the word lines.

A method of operating a non-volatile memory device according to yet another aspect of the present disclosure includes erasing a memory cell block; performing a first program operation by supplying a turn-on voltage to the select lines of the memory cell block and supplying a first program voltage to the word lines of the memory cell block; discharging the select lines and the word lines after performing the first program operation; and performing a second program operation by supplying a turn-on voltage of a target level to the select lines and supplying a second program voltage higher than the first program voltage to word lines adjacent to the respective select lines, from among the word lines after the discharging.

A method of operating a non-volatile memory device according to further yet another aspect of the present disclosure includes erasing a memory cell block; supplying a turn-on voltage to the select lines of the memory cell block and supplying a program voltage to word lines adjacent to the select lines; and performing a soft program operation by supplying the program voltage to the remaining word lines of the memory cell block.

BRIEF DESCRIPTION OF THE DRAWINGS

FIGS. 7A to 7B are timing diagrams illustrating soft program methods using the memory cell block of FIG. 6 according to exemplary embodiments of this disclosure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
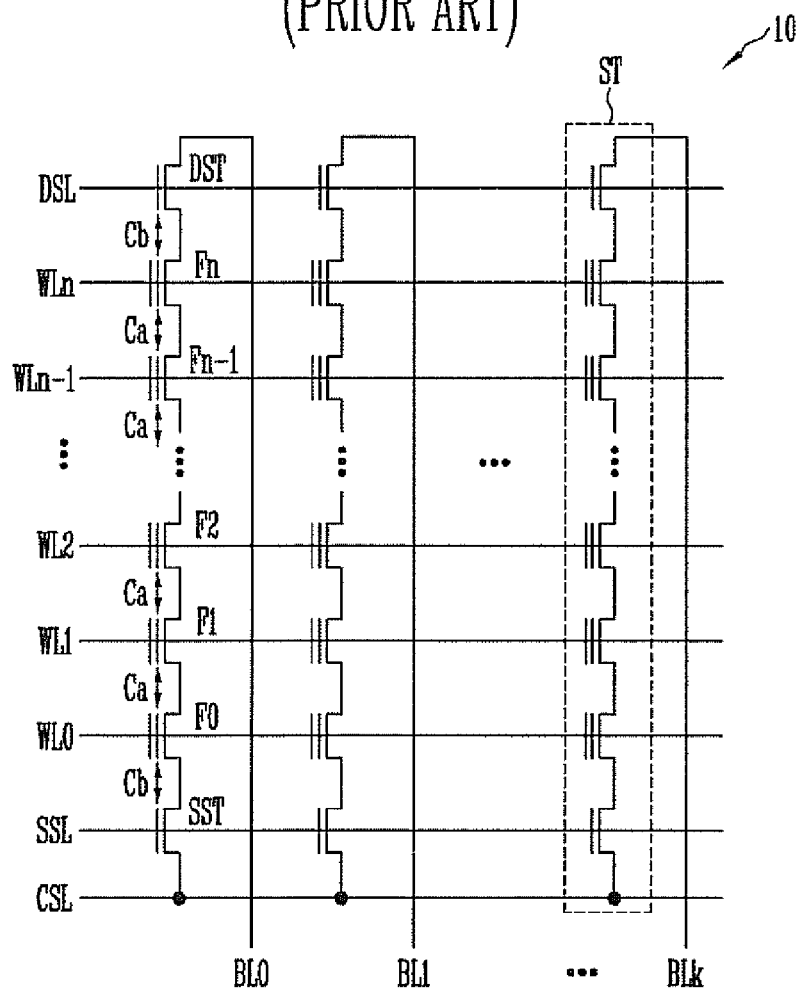
FIGS. 1 and 2 are diagrams illustrating a conventional memory program method.
Figure 2:
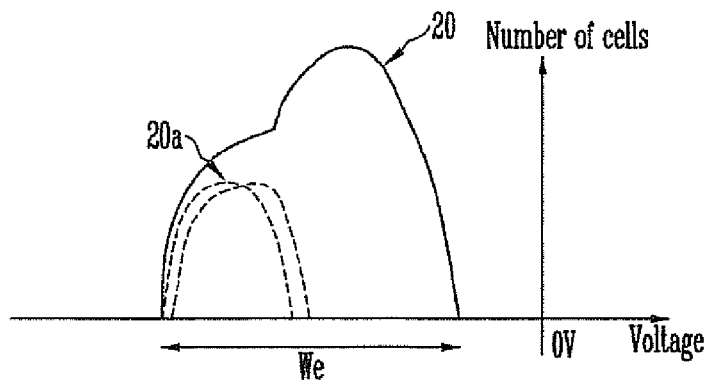
Figure 3:
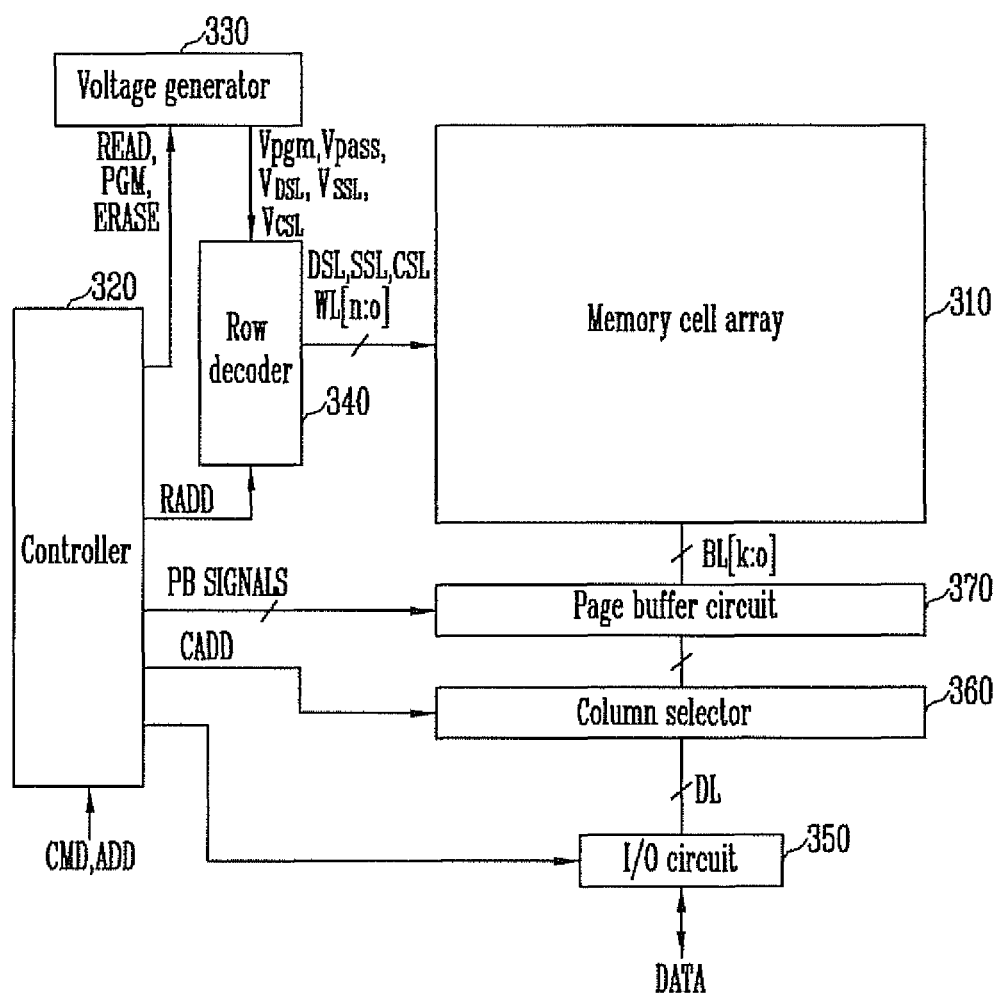
FIG. 3 is a block diagram illustrating a non-volatile memory device according to an exemplary embodiment of this disclosure.

FIG. 3 is a block diagram illustrating a non-volatile memory device according to an exemplary embodiment of this disclosure.

The semiconductor memory device according to an exemplary embodiment of this disclosure includes a memory cell array 310, a controller 320, a voltage generator 330, a row decoder 340, an input/output (I/O) circuit 350, a column selector 360, and a page buffer circuit 370.

The memory cell array 310 includes a plurality of memory cell blocks in which data is stored, and each of the memory cell blocks includes a plurality of memory cells.

The controller 320 internally generates a program operation signal PGM, a read operation signal READ or the erase operation signal ERASE in response to a command signal CMD and generates control signals PS SIGNALS for controlling the page buffers (not shown) of the page buffer circuit 370 depending on a type of an operation. Furthermore, the controller 320 internally generates a row address signal RADD and a column address signal CADD in response to an address signal ADD.

The voltage generator 330 outputs operating voltages Vpgm, Vpass, $V_{DSL}$, $V_{SSL}$, and $V_{CSL}$ for programming, reading, or erasing the memory cells global lines in response to the operating signals PGM, READ, and ERASE, which are the internal command signals of the controller 320.

The row decoder 340 transfers the operating voltages Vpgm, Vpass, $V_{DSL}$, $V_{SSL}$, and $V_{CSL}$ of the voltage generator 330 to a memory cell block, selected from the memory cell blocks of the memory cell array 310, in response to the row address signals RADD of the controller 320. Here, the operating voltages Vpgm, Vpass, $V_{DSL}$, $V_{SSL}$, and $V_{CSL}$ are transferred to the local lines DSL, WL[n:0], and SSL of the selected memory cell block.

The page buffer circuit 370 includes page buffers (not shown) coupled to respective bit lines BL [k:0] (that is, BL [o] to BL [k]) and supplies a voltage applied to store data in the memory cells to each of the bit lines BL [k:0] in response to the control signals PB SIGNALS of the controller 320.

The column selector 360 selects the page buffers (not shown) of the page buffer circuit 370 in response to a column address signal CADD generated from the controller 320. Data latched in a page buffer selected by the column selector 360 is externally outputted.

The I/O circuit 350 transfers external input data to the column selector 360 under the control of the controller 320 at the time of a program operation so that the external input data is inputted to the page buffer circuit 370. When the column selector 360 transfers the external input data to the page buffer circuit 370, the page buffer circuit 370 stores the external input data in the internal latches of the page buffers. Furthermore, in a read operation, the I/O circuit 350 externally outputs data received from the page buffer circuit 370 via the column selector 360.

Figure 4:
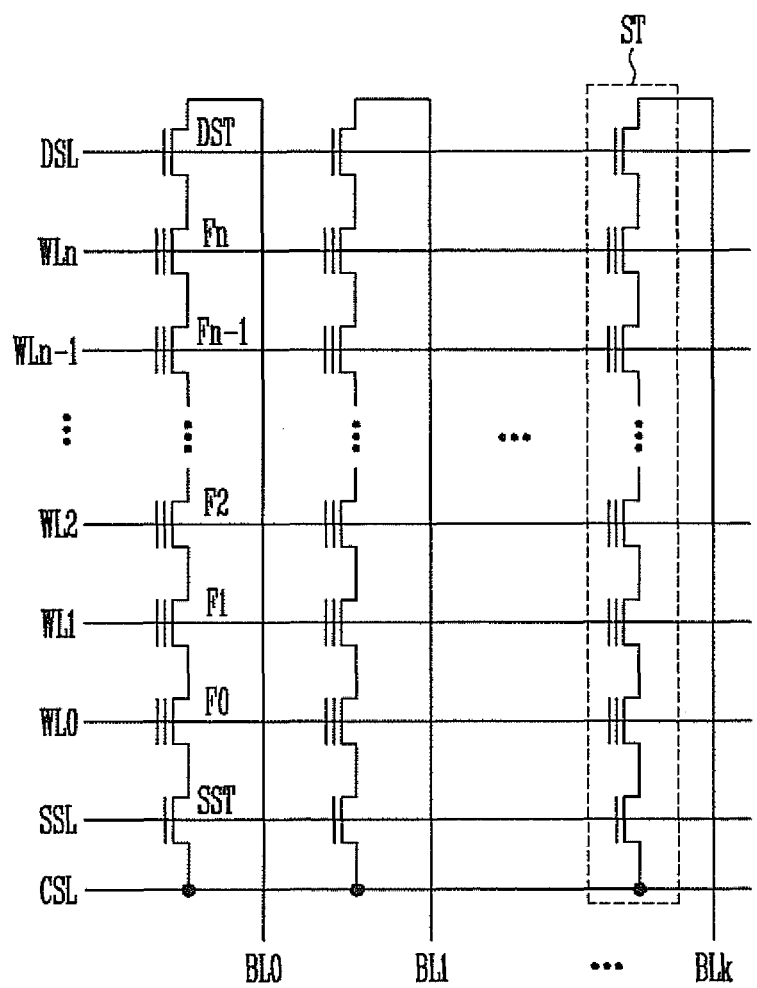
FIG. 4 is a circuit diagram of a memory cell block according to an exemplary embodiment of this disclosure.

FIG. 4 is a circuit diagram of a memory cell block of the memory cell array 310 of FIG. 3 according to an exemplary embodiment of this disclosure.

The memory cell array 310 includes a plurality of memory cell blocks having the same structure, and thus one of the memory cell blocks is described in detail with reference to FIG. 4. It is also to be noted that the memory cell block of FIG. 3 is assumed to be selected hereinafter.

The memory cell block includes a plurality of cell strings ST. Each of the cell strings ST includes a drain select transistor DST, a source select transistor SST, and a plurality of memory cells F0 to Fn coupled in series between the drain select transistor DST and the source select transistor SST. Each of the cell strings ST includes a drain select transistor DST, a source select transistor SST, and a plurality of memory cells F0 to Fn coupled in series between the drain select transistor DST and the source select transistor SST. The drains of the drain select transistors DST included in the respective cell strings are coupled to respective bit lines BL0 to $BL_k$, and the sources of the source select transistors SST included in the respective cell strings are coupled to a common source line CSL. The gates of the drain select transistors DST belonging to the different strings ST are coupled to form part of a drain select line DSL, and the gates of the source select transistors SST belonging to the different strings ST are coupled to form part of a source select line SSL. Furthermore, the gates of the memory cells F0 to Fn belonging to the different strings ST are coupled to form part of respective word lines WL0 to WLn.

FIGS. 5A to 5D are timing diagrams illustrating soft program methods using the memory cell block of FIG. 4 according to exemplary embodiments of this disclosure.

A soft program operation is performed in order to raise the threshold voltages of memory cells, erased after an erase operation is performed on the memory cell block, to a level lower than 0 V. Thus, according to an example, in the soft program operation, the memory cells have a target voltage lower than 0 V.

A soft program method according to a first embodiment of this disclosure is described below.

Figure 5A:
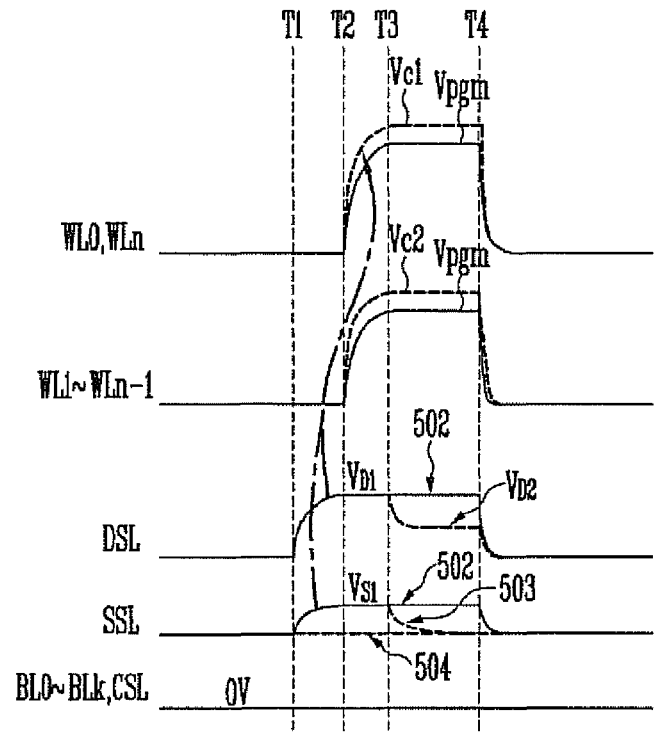
FIGS. 5A to 5D are timing diagrams illustrating soft program methods using the memory cell block of FIG. 4 according to exemplary embodiments of this disclosure.

Referring to FIGS. 4 and 5A, 0 V is supplied to all of the bit lines BL0 to $BL_k$ and the common source line CSL. At time point T1, the potentials of the drain and source select lines DSL and SSL are raised (502). The potentials of the drain and source select lines DSL and SSL are raised to a level at which the drain and source select transistors DST and SST are turned on. In particular, in order to raise the potentials of the edge word lines WL0 and WLn adjacent to the respective drain and source select lines SSL and DSL, first drain and source turn-on voltages $V_{D1}$ and $V_{S1}$ are supplied to all of the bit lines BL0 to $BL_k$ and the common source line CSL. To this end, a voltage supplied to the drain select line DSL is called a first drain turn-on voltage $V_{D1}$, and it is assumed that the first drain turn-on voltage $V_{D1}$ has 5 V to 10 V. In order for the drain select transistor DST to be turned on, a voltage of 2 V or higher is to be supplied to the drain select line DSL. In order to raise the potential of the $(n+1)^{th}$ word line WLn adjacent to the drain select line DSL, the first drain turn-on voltage $V_{D1}$ of 5 V to 10 V, which is higher than 2 V is supplied to the drain select line DSL. Furthermore, in order to raise the potential of the first word line WL0 adjacent to the source select line SSL, a voltage having a high level is supplied to the source select line SSL.

While the source select transistor SST is turned off (504), according to an example, the source select transistor SST is turned on in order to couple the common source line CSL having a level of 0 V and the string and thus, improve program efficiency (502). Assuming that a voltage supplied to the source select line SSL is called the first source turn-on voltage $V_{S1}$, the first source turn-on voltage $V_{S1}$ may have a level of 3 V to 5 V. The first source turn-on voltage $V_{S1}$ supplied to the source select line SSL may have the same level as the first drain turn-on voltage $V_{D1}$. According to an example, the level of the first source turn-on voltage $V_{S1}$ is determined in consideration of stress applied to a transistor, which increases according to a higher voltage level.

At time point T2, a program voltage Vpgm is supplied to all of the word lines WL0 to WLn. The program voltage Vpgm may have a level of 9 V to 15 V. At this time, since a voltage of a high level is supplied to the drain and source select lines DSL and SSL adjacent to the respective edge word lines WL0 and WLn, the potential of each of the edge word lines WL0 and WLn is raised due to capacitive coupling. The raised potential of each of the edge word lines WL0 and WLn is called a first program level Vc1. Furthermore, the potential of each of the remaining word lines WL1 to WLn−1 other than the edge word lines WL0 and WLn is also raised due to mutual capacitive coupling, thus having a second program level Vc2.

After supplying the program voltage Vpgm to all of the word lines WL0 to WLn, the first drain turn-on voltage $V_{D1}$ and the first source turn-on voltage $V_{S1}$ may be maintained in the drain and source select lines DSL and SSL, respectively, until all of the word lines are discharged (that is, time point T4) (502), but they may be lowered at time point T3 in order to prohibit an increase of stress applied to the drain and source select transistors DST and SST (503). The time point T3 is set after a lapse of 2 µs to 10 µs from the time point T2. That is, after supplying the program voltage Vpgm to the word lines WL0 to WLn, the potential of each of the drain and source select lines DSL and SSL remains high for 2 µs to 10 µs. Accordingly, a drop in the potential of each of the edge word lines WL0 and WLn may be prevented. The second drain turn-on voltage $V_{D2}$ may have a level of 1 V to 4 V.

At the time point T4, all of the word lines WL0 to WLn and the drain and source select lines DSL and SSL are discharged.

Likewise, the soft program operation is performed until the threshold voltage of at least one of the memory cells included in the memory cell block reaches the target level lower than 0 V while the program voltage Vpgm is gradually raised.

A soft program method according to a second embodiment of this disclosure is described below.

Figure 5B:
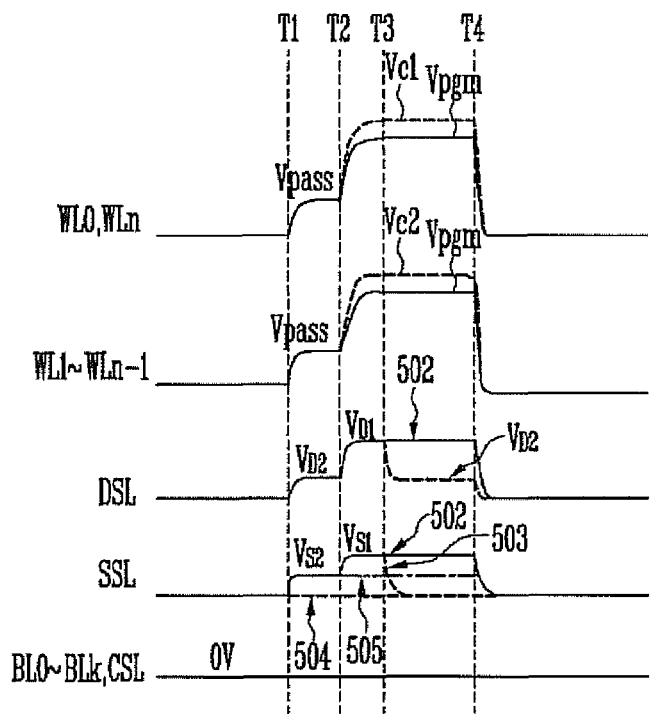

Referring to FIGS. 4 and 5B, 0 V is supplied to all of the bit lines BL0 to $BL_k$ and the common source line CSL. At time point T1, a second drain turn-on voltage $V_{D2}$ is supplied to the drain select line DSL, and a second source turn-on voltage $V_{S2}$ is supplied to the source select line SSL. The second drain turn-on voltage $V_{D2}$ may have a level of 1 V to 4 V, and the second source turn-on voltage $V_{S2}$ may have a level of 0 V or 1 V. Furthermore, at the time point T1, the program pass voltage Vpass is supplied to all of the word lines WL0 to WLn.

At time point T2 at which a program voltage Vpgm is supplied, the potentials of the drain and source select lines DSL and SSL may raise to a first drain turn-on voltage $V_{D1}$ and a first source turn-on voltage $V_{S1}$, respectively, (502) or the potential of the source select line SSL may maintain the second source turn-on voltage $V_{S2}$ (505). Here, the first drain turn-on voltage $V_{D1}$ may have a level of 5 V to 10 V, and the first source turn-on voltage $V_{S1}$ may have a level of 3 V to 5 V. In order for the drain select transistor DST to be turned on, a voltage of 2 V or higher is to be supplied to the drain select line DSL, but in order to raise the potential of the $(n+1)^{th}$ word line WLn adjacent to the drain select line DSL, the first drain turn-on voltage $V_{D1}$ of 5 V to 10 V is supplied to the drain select line DSL. Furthermore, in order to raise the potential of the first word line WL0 adjacent to the source select line SSL, the first source turn-on voltage $V_{S1}$ is supplied to the source select line SSL (502). While the source select transistor SST is turned off (504) or is weakly turned on by the second source turn-on voltage $V_{S2}$ (505), according to an example, the source select transistor SST is to be sufficiently turned on in order to further lower the channel voltage of the string so that the common source line CSL having 0 V and the string are coupled. Although the first source turn-on voltage $V_{S1}$ supplied to the source select line SSL may have the same level as the first drain turn-on voltage $V_{D1}$, according to an example, the level of the first source turn-on voltage $V_{S1}$ is to be determined in consideration of stress applied to a transistor, which increases according to a higher voltage level. When a voltage is supplied to the drain and source select lines DSL and SSL, the program voltage Vpgm is supplied to all of the word lines WL0 to WLn. The program voltage Vpgm may have a level of 9 V to 15 V. In this case, since the first drain and source turn-on voltages having a high level are supplied to the drain and source select lines DSL and SSL adjacent to the respective edge word lines WL0 and WLn, the potentials of the edge word lines WL0 and WLn are raised due to capacitive coupling between the word lines WL1 and WLn−1 adjacent to the respective edge word lines WL0 and WLn and the drain and source select lines DSL and SSL. The raised potential of each of the edge word lines WL0 and WLn is called a first program level Vc1. The potential of each of the remaining word lines WL1 to WLn−1 other than the edge word lines WL0 and WLn is also raised due to mutual capacitive coupling, thus having a second program level Vc2. A difference between the first and the second program levels Vc1 and Vc2 is great before raising the potential of each of the drain and source select lines DSL and SSL, but a difference between the first and the second program levels Vc1 and Vc2 may be reduced by raising the potential of each of the drain and source select lines DSL and SSL.

At time point T3, the first drain turn-on voltage $V_{D1}$ and the second source turn-on voltage $V_{S1}$ supplied to the respective drain and source select lines DSL and SSL may remain intact (502). According to an example, the first drain turn-on voltage $V_{D1}$ and the second source turn-on voltage $V_{S1}$ are to be lowered at the time point T3 in order to prohibit stress applied to the drain and source select transistors DST and SST (503). The time point T3 is set after a lapse of 2 μs to 10 μs from the time point T2. That is, after supplying the program voltage Vpgm to the word lines WL0 to WLn, the potential of each of the drain and source select lines DSL and SSL remains high for 2 μs to 10 μs in order to prevent a drop in the potential of each of the edge word lines WL0 and WLn.

At time point T4, after discharging all of the word lines WL0 to WLn and the drain and source select lines DSL and SSL, a soft program verify operation (not shown), that is, a subsequent operation is performed.

Likewise, the soft program operation is performed until the threshold voltage of at least one of the memory cells included in the memory cell block reaches the target level lower than 0 V while the program voltage Vpgm is gradually raised at each reprogram stage.

A soft program method according to a third embodiment of this disclosure is described below.

Figure 5C:
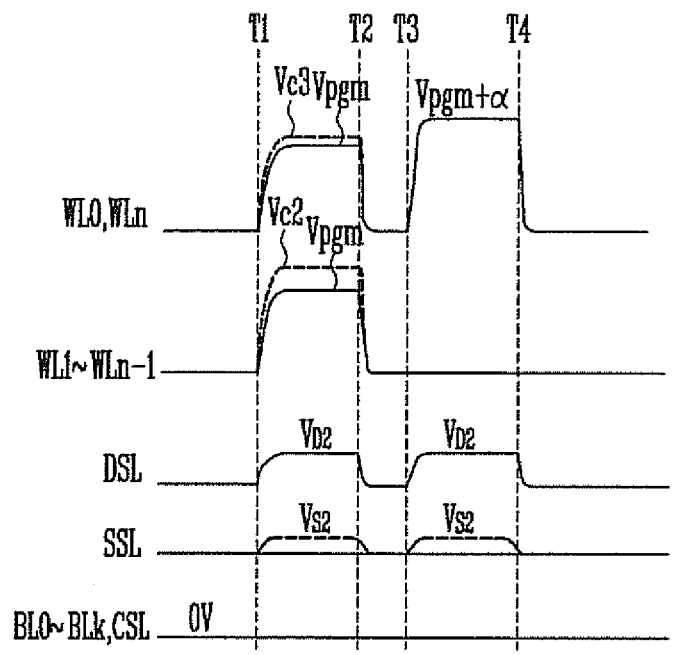

Referring to FIGS. 4 and 5C, 0 V is supplied to all of the bit lines BL0 to $BL_k$ and the common source line CSL. At time point T1 at which a program operation is started, a turn-on voltage is supplied to the drain and source select lines DSL and SSL. A second drain turn-on voltage $V_{D2}$ is supplied to the drain select line DSL, and 0 V or a second source turn-on voltage $V_{S2}$ may be supplied to the source select line SSL. The second source turn-on voltage $V_{S2}$ is supplied to the source select line SSL to improve program efficiency by coupling the common source line CSL, to which 0 V is supplied, and the string. At the time point T1, a first program voltage Vpgm is supplied to all of the word lines WL0 to WLn. At this time, the potential of each of the edge word lines WL0 and WLn is smaller than that of each of the remaining word lines WL1 to WLn−1 because each of the edge word lines WL0 and WLn has smaller capacitive coupling than each of the remaining word lines WL1 to WLn−1. That is, while the potential of each of the remaining word lines WL1 to WLn−1 rises to the second program level Vc2, the potential of each of the edge word lines WL0 and WLn rises to a third program level Vc3 lower than the second program level Vc2. Accordingly, the threshold voltages of the memory cells coupled to the edge word lines WL0 and WLn rise less than those of the memory cells coupled to the remaining word lines WL1 to WLn−1.

At time point T2, all of the word lines WL0 to WLn and the drain and source select lines DSL and SSL are discharged.

At time point T3, in order to raise the threshold voltages of the memory cells coupled to the edge word lines WL0 and WLn, a second program voltage Vpgm+α higher than the first program voltage Vpgm is supplied to, for example, only the edge word lines WL0 and WLn. If the first program voltage Vpgm has a level of 9 V to 15 V, the second program voltage Vpgm+α may have a level of 10 V to 18 V. The second program voltage Vpgm+α is supplied until time point T4. According to an example, a period from the time point T1 to the time point T2 is equal to a period from the time point T3 to the time point T4. In the two periods, the second drain turn-on voltage $V_{D2}$ is supplied to the drain select line DSL, and the source select line SSL may maintain 0 V or the second source turn-on voltage $V_{S2}$ may be supplied to the source select line SSL.

Likewise, the soft program operation is performed until the threshold voltage of at least one of the memory cells included in the memory cell block reaches a target level lower than 0 V while the program voltage is gradually raised for each reprogram stage.

As described above, the threshold voltages of all of the memory cells may be uniformly raised in such a manner that the threshold voltages of the memory cells are raised by supplying the first program voltage Vpgm to all of the word lines WL0 to WLn and the threshold voltages of the memory cells coupled to the edge word lines WL0 and WLn, which are raised to a smaller extent than the threshold voltage for the word lines in-between, are subsequently raised.

A soft program method according to a fourth embodiment of this disclosure is described below.

Figure 5D:
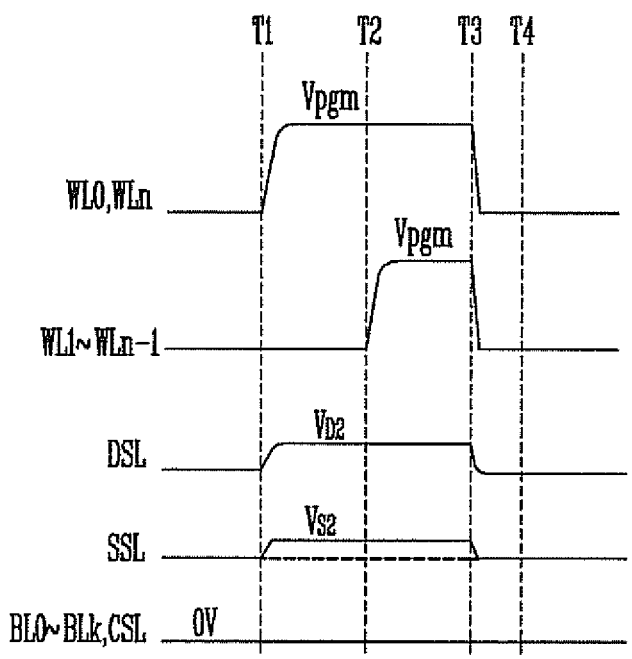

Referring to FIGS. 4 and 5D, at time point T1 at which a program operation is started, a program voltage Vpgm is first supplied to the edge word lines WL0 and WLn. At this time, a second drain turn-on voltage $V_{D2}$ is supplied to the drain select line DSL, and the second source turn-on voltage $V_{S2}$ or 0 V may be supplied to the source select line SSL. In the state in which the program voltage Vpgm is supplied to the edge word lines WL0 and WLn, at time point T2, the program voltage Vpgm is also supplied to the remaining word lines WL1 to WLn−1. At time point T3, all of the word lines WL0 to WLn and the drain and source select lines DSL and SSL are discharged. Furthermore, a period from the time point T1 to the time point T2 may be equal to a period from the time point T2 to the time point T3.

Likewise, the soft program operation is performed until the threshold voltage of at least one of the memory cells included in the memory cell block reaches a target level lower than 0 V while the program voltage is gradually raised.

Figure 6:
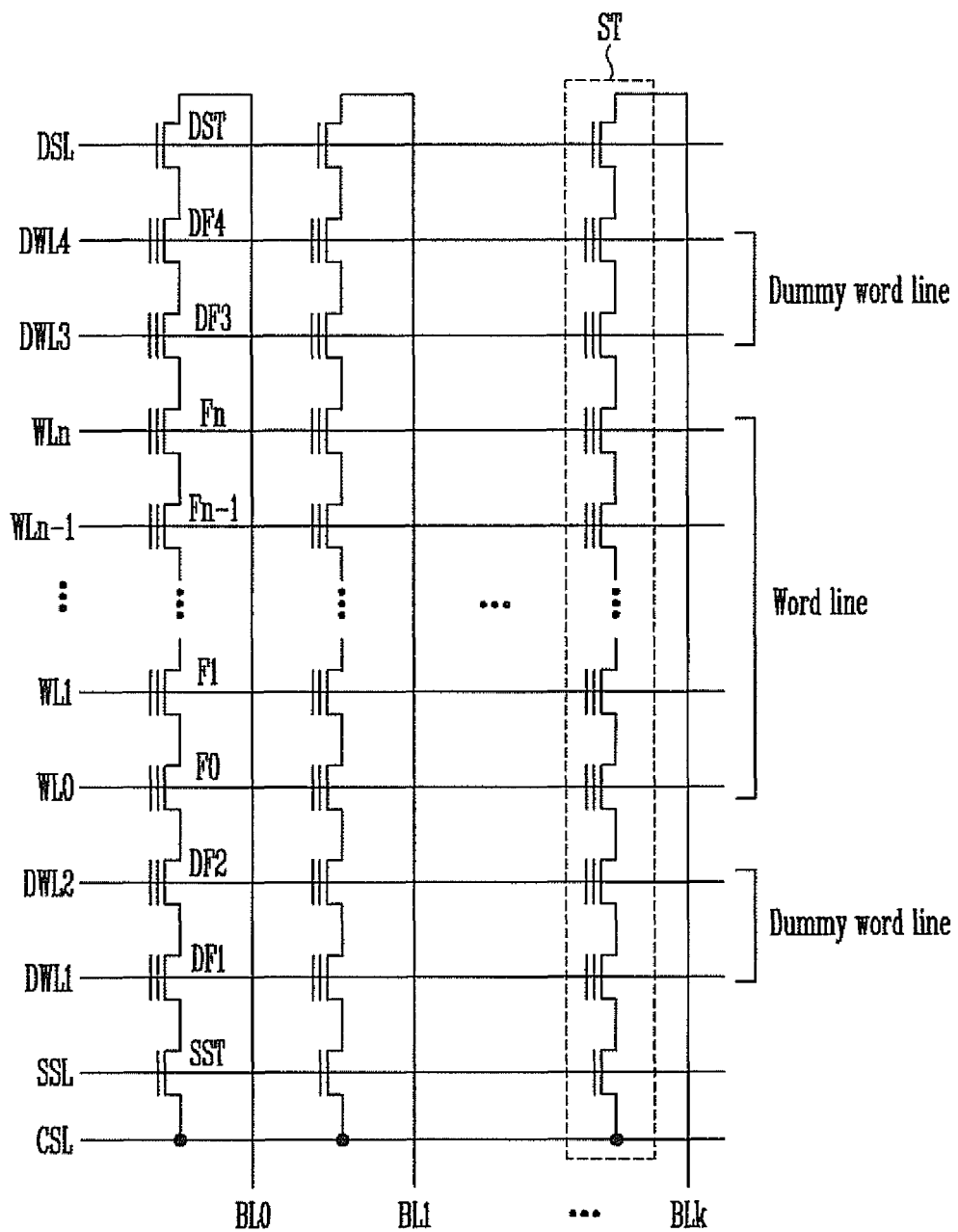
FIG. 6 is a circuit diagram of a memory cell block according to another exemplary embodiment of this disclosure.

FIG. 6 is a circuit diagram of a memory cell block according to another exemplary embodiment of this disclosure.

The memory cell array 310 includes a plurality of memory cell blocks having the same structure, and thus one of the memory cell blocks is described in detail with reference to FIG. 6. It is hereinafter assumed that the memory cell block of FIG. 6 is selected.

The memory cell block includes a plurality of cell strings ST. Each of the cell strings ST includes a drain select transistor DST, dummy cells DF4 and DF3, a plurality of memory cells F0 to Fn, a source select transistor SST, and dummy cells DF2 and DF1 which are coupled in series. The drains of the drain select transistors DST included in the respective cell strings are coupled to respective bit lines BL0 to $BL_k$, and the sources of the source select transistors SST included in the respective cell strings are coupled to a common source line CSL. The gates of the drain select transistors DST belonging to the different strings ST are coupled to form part of a drain select line DSL, and the gates of the source select transistors SST belonging to the different strings ST are coupled to form part of a source select line SSL. Furthermore, the gates of the memory cells F0 to Fn belonging to the different strings ST are coupled to form respective word lines WL0 to WLn. The gates of the dummy cells DF1 to DF4 belonging to different strings ST are coupled to form dummy word lines DWL1 to DWL4, respectively. Substantial operations, such as program, read, and erase operations, are not performed on the dummy cells DF1 to DF4, but the dummy cells DF1 to DF4 operate to assist an increase of the threshold voltages of the memory cells coupled to the edge word lines WL0 and WLn during a program or soft program operation. To this end, the dummy cells DF1 to DF4 have the same structure as the memory cells F0 to Fn. Furthermore, the two dummy word lines DWL3 and DWL4 are illustrated as being included between a word line (for example, WLn) and a select line (for example, DSL) in the exemplary embodiment of this disclosure, but one or a plurality of dummy word lines may be included between the word line WLn and the select line DSL.

Figure 7A:
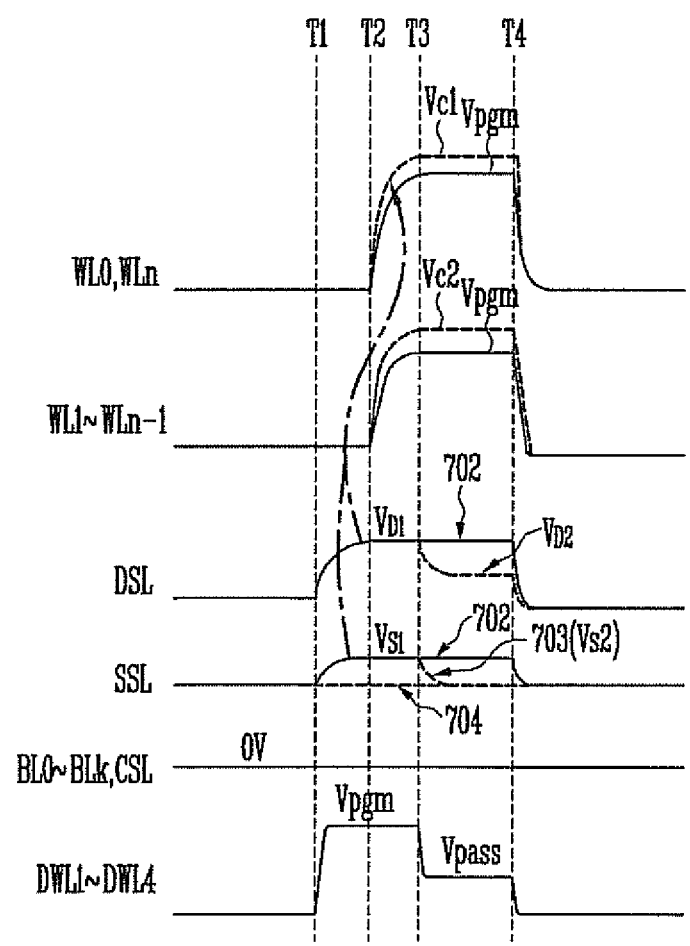

FIGS. 7A to 7B are timing diagrams illustrating soft program methods using the memory cell block of FIG. 6 according to exemplary embodiments of this disclosure.

A soft program operation is performed in order to raise the threshold voltages of memory cells, erased after an erase operation is performed on the memory cell block, to a level lower than 0 V.

A soft program method according to a fifth embodiment of this disclosure is described below.

Referring to FIGS. 6 and 7A, 0 V is supplied to all of the bit lines BL0 to $BL_k$ and the common source line CSL. At time point T1, the potential of each of the drain and source select lines DSL and SSL is raised (702). According to another example, while the potential of the drain select line DSL may be raised, the potential of the source select line SSL may maintain 0 V (704). In case of '702', the potential of each of the drain and source select lines DSL and SSL has a level at which the drain and source select transistors DST and SST are turned on.

According to an example, in order to raise the potential of each of the edge word lines WL0 and WLn adjacent to the respective drain and source select lines DSL and SSL, turn-on voltages $V_{D1}$ and $V_{S1}$ each having a high level are supplied to the drain and source select lines DSL and SSL. To this end, assuming that a voltage supplied to the drain select line DSL is called a first drain turn-on voltage $V_{D1}$, the first drain turn-on voltage $V_{D1}$ may have a level of 5 V to 10 V. In order for the drain select transistor DST to be turned on, a voltage of 2 V or higher is to be supplied to the drain select line DSL. In order to raise the potential of the $(n+1)^{th}$ word line WLn, the first drain turn-on voltage $V_{D1}$ having a high level of 5 V to 10 V may be supplied to the $(n+1)^{th}$ word line WLn. Furthermore, in order to raise the potential of the first word line WL0, a voltage of a high level is supplied to the source select line SSL. Although the source select transistor SST is turned off, according to an example, the common source line CSL having a level of 0 V and the string are coupled to each other in order to improve program efficiency. Assuming that a voltage supplied to the source select line SSL is called a first source turn-on voltage $V_{S1}$, the first source turn-on voltage $V_{S1}$ may have a level of 3 V to 5 V. The first source turn-on voltage $V_{S1}$ supplied to the source select line SSL may have the same level as the first drain turn-on voltage $V_{D1}$. According to an example, the level of the first source turn-on voltage $V_{S1}$ is to be determined in consideration of stress applied to a transistor, which increases according to a higher voltage level. Furthermore, at the time point T1, in order to further raise the potential of each of the edge word lines WL0 and WLn, a program voltage Vpgm is supplied to the dummy word lines DWL1 to DWL4 together with the drain and source select lines DSL and SSL. When the program voltage Vpgm is supplied to the dummy word lines DWL1 to DWL4, the same capacitive coupling as that of the remaining word lines WL1 to WLn−1 is generated in the edge word lines WL0 and WLn.

At time point T2, the program voltage Vpgm is supplied to all of the word lines WL0 to WLn. The program voltage Vpgm may have 9 V to 15 V. At this time, since a voltage of a high level is supplied to the dummy word lines DWL1 to DWL4 and the drain and source select lines SSL and DSL adjacent to the edge word lines WL0 and WLn, the potential of each of the edge word lines WL0 and WLn rises due to capacitive coupling. The raised potential of each of the edge word lines WL0 and WLn is called a first program level Vc1. The potential of each of the remaining word lines WL1 to WLn−1 other than the edge word lines WL0 and WLn also rises due to mutual capacitive coupling, thus having a second program level Vc2.

After supplying the program voltage Vpgm to all of the word lines WL0 to WLn, the first drain turn-on voltage $V_{D1}$ and the first source turn-on voltage $V_{S1}$ may be supplied to the respective drain and source select lines DSL and SSL until the word lines WL0 to WLn are discharged at time point T4 (702). In order to prohibit an increase of stress applied to the dummy cells DF1 to DF4 and the drain and source select transistors DST and SST, according to an example, the potential of each of the dummy word lines DWL1 to DWL4 and the drain and source select lines DSL and SSL is lowered at time point T3. The time point T3 is set after a lapse of 2 µs to 10 µs from the time point T2. That is, after the program voltage Vpgm is supplied to all of the word lines WL0 to WLn, the potential of each of the dummy word lines DWL1 to DWL4 and the drain and source select lines DSL and SSL remains high for 2 µs to 10 µs. In this case, the potential of each of the edge word lines WL0 and WLn may be prevented from falling.

At the time point T3, the potential of each of the drain and source select lines DSL and SSL may remain intact (702) or drop to a second drain turn-on voltage $V_{D2}$ and a second source turn-on voltage $V_{S2}$ in order to reduce stress applied to the drain and source select transistors DST and SST (703). The second drain turn-on voltage $V_{D2}$ may have a level of 1 V to 4 V, and the second source turn-on voltage $V_{S2}$ may have 0 V or a level lower than 1 V. Furthermore, at the time point T3, according to an example, the voltage supplied to the dummy word lines DWL1 to DWL4 is lowered to the program pass voltage Vpass in order to reduce stress that may be applied to the dummy cells DF1 to DF4 (703).

At time point T4, all of the word lines WL0 to WLn, the drain and source select lines DSL and SSL, and all of the dummy word lines DWL1 to DWL4 are discharged. Next, a soft program verify operation (not shown) (that is, a subsequent operation) is performed.

Likewise, the soft program operation is performed until the threshold voltage of at least one of the memory cells included in the memory cell block reaches a target level lower than 0 V while the program voltage is gradually raised.

A soft program method according to a sixth embodiment of this disclosure is described below.

Referring to FIGS. 6 and 7B, 0 V is supplied to all of the bit lines BL0 to $BL_k$ and the common source line CSL. At time point T1, a second drain turn-on voltage $V_{D2}$ is supplied to the drain select line DSL, and a second source turn-on voltage $V_{S2}$ is supplied to the source select line SSL. In an alternative embodiment, a ground voltage 0 V may be supplied to the source select line SSL (704). The second drain turn-on voltage $V_{D2}$ may have a level of 1 V to 4 V, and the second source turn-on voltage $V_{S2}$ may have a level lower than 0 V or 1 V. A program pass voltage Vpass is supplied to the dummy word lines DWL1 to DWL4. Furthermore, at the time point T1, the program pass voltage Vpass is supplied to all of the word lines WL0 to WLn.

At time point T2 at which a program voltage Vpgm is supplied, the potentials of the drain and source select lines DSL and SSL are raised to a first drain turn-on voltage $V_{D1}$ and a first source turn-on voltage $V_{S1}$, respectively. In an alternative embodiment, when raising the potential of the drain select line DSL to the first drain turn-on voltage $V_{D1}$, the potential of the source select line SSL may maintain the second source turn-on voltage $V_{S2}$ (705). The first drain turn-on voltage $V_{D1}$ may have a level of 5 V to 10 V, and the first source turn-on voltage $V_{S1}$ may have a level of 3 V to 5 V. In order for the drain select transistor DST to be turned on, a voltage of 2 V or higher is to be supplied to the drain select line DSL. In order to raise the potential of each of the dummy word lines DWL3 and DWL4 adjacent to the drain select line DSL, however, the first drain turn-on voltage $V_{D1}$ having a high level of 5 V to 10 V is supplied to the drain select line DSL. Furthermore, in order to raise the potential of each of the dummy word lines DWL1 and DWL2 adjacent to the source select line SSL, the first source turn-on voltage $V_{S1}$ is supplied to the source select line SSL. Although the source select transistor SST is turned off, according to an example, the common source line CSL having a level of 0 V and the string are coupled in order to further lower the channel voltage of the string. The first source turn-on voltage $V_{S1}$ supplied to the source select line SSL may also have the same level as the first drain turn-on voltage $V_{D1}$. According to an example, the level of the first source turn-on voltage $V_{S1}$ is determined in consideration of stress applied to a transistor, which increases according to a higher voltage level.

The program voltage Vpgm is supplied to all of the word lines WL0 to WLn. The program voltage Vpgm may have a level of 9 V to 15 V. At this time, since the program voltage Vpgm is supplied to the dummy word lines DWL1 to DWL4 adjacent to the edge word lines WL0 and WLn, the potential of each of the edge word lines WL0 and WLn rises due to capacitive coupling. The raised potential of each of the edge word lines WL0 and WLn is called a first program level Vc1. Furthermore, the potential of each of the remaining word lines WL1 to WLn−1 other than the edge word lines WL0 and WLn rises due to mutual capacitive coupling, thus having a second program level Vc2.

The potentials of the edge word lines WL0 and WLn adjacent to the dummy word lines DWL1 to DWL4 are raised by raising the potentials of the dummy word lines DWL1 to DWL4 to the program voltage Vpgm. That is, when the potentials of the drain and source select lines DSL and SSL are raised, the potentials of the dummy word lines DWL1 to DWL4 may be raised, and when the potentials of the dummy word lines DWL1 to DWL4 are raised, the potentials of the edge word lines WL0 and WLn may be raised.

At time point T3, the first drain turn-on voltage $V_{D1}$ and the first source turn-on voltage $V_{S1}$ supplied to the drain and source select lines DSL and SSL, respectively, may remain intact (702). According to an example, the first drain turn-on voltage $V_{D1}$ and the first source turn-on voltage $V_{S1}$ are lowered at the time point T3 in order to prohibit an increase of stress applied to the dummy cells DF0 to DF4 and the drain and source select transistors DST and SST (703). The time point T3 is set after a lapse of 2 μs to 10 μs from the time point T2. That is, after supplying the program voltage Vpgm to the word lines WL0 to WLn, the potential of each of the dummy word lines DWL1 to DWL4 and the drain and source select lines DSL and SSL remains high for 2 μs to 10 μs in order to prevent a drop in the potential of each of the edge word lines WL0 and WLn.

At time point T4, after all of the word lines WL0 to WLn, the dummy word lines DWL1 to DWL4, and the drain and source select lines DSL and SSL are discharged, a soft program verify operation (not shown), that is, a subsequent operation is performed.

Likewise, the soft program operation is performed until the threshold voltage of at least one of the memory cells included in the memory cell block reaches a target level lower than 0 V while the program voltage is gradually raised.

In accordance with this disclosure, the time taken to perform a program operation may be efficiently reduced because the threshold voltages of memory cells having an erase state may be raised and a distribution of the threshold voltages may be narrowed.

What is claimed is:

1. A method of operating a non-volatile memory device, comprising:
   erasing a memory cell block;
   supplying a first drain turn-on voltage higher than a target level to a drain select line of the memory cell block; and
   performing a soft program operation by supplying a soft program voltage to word lines of the memory cell block.

2. The method of claim 1, wherein the first drain turn-on voltage is supplied to the drain select line before supplying the soft program voltage to the word lines.

3. The method of claim 2, further comprising supplying a first source turn-on voltage to a source select line of the memory cell block while supplying the first drain turn-on voltage to the drain select line, wherein the first source turn-on voltage has a positive voltage lower than the first drain turn-on voltage.

4. The method of claim 3, further comprising:
   continuing to supply the first drain turn-on voltage to the drain select line while performing the soft program operation by supplying the soft program voltage to the word lines; and
   continuing to supply the first source turn-on voltage to the source select line while supplying the first drain turn-on voltage to the drain select line.

5. The method of claim 4, further comprising performing the soft program operation by lowering the first drain turn-on voltage to a positive voltage lower than a second drain turn-on voltage and lowering the second source turn-on voltage to a ground voltage after supplying the soft program voltage to the word lines.

6. The method of claim 2, further comprising supplying a ground voltage to a source select line of the memory cell block while supplying the first drain turn-on voltage to the drain select line.

7. The method of claim 1, wherein when dummy lines are included between the drain select line and the word lines and between a source select line of the memory cell block and the word lines,
   a program voltage is supplied to the dummy lines while supplying the first turn-on voltage to the drain select line, and
   a program pass voltage lower than the soft program voltage is supplied to the dummy lines while supplying the soft program voltage to the word lines.

8. A method of operating a non-volatile memory device, comprising:
   erasing a memory cell block;
   supplying a turn-on voltage having a target level to a drain select line of the memory cell block and supplying a program pass voltage to word lines of the memory cell block; and performing a soft program operation by supplying a first drain turn-on voltage higher than the target level to the drain select line and supplying the soft program voltage to the word lines.

9. The method of claim 8, further comprising supplying a first source turn-on voltage to a source select line of the memory cell block while supplying the first drain turn-on voltage to the drain select line, wherein the first source turn-on voltage has a positive voltage lower than the first drain turn-on voltage.

10. The method of claim 9, further comprising:
supplying a second drain turn-on voltage lower than the first drain turn-on voltage to the drain select line while supplying the program pass voltage to the word lines; and
supplying a second source turn-on voltage lower than the first source turn-on voltage to the source select line while supplying the second drain turn-on voltage to the drain select line.

11. The method of claim 9, further comprising:
supplying the first drain turn-on voltage to the drain select line while performing the soft program operation by supplying the soft program voltage to the word lines; and
continuing to supply the first source turn-on voltage to the source select line while supplying the first drain turn-on voltage to the drain select line.

12. The method of claim 11, further comprising performing the soft program operation by lowering the first drain turn-on voltage to a second drain turn-on voltage and lowering a second source turn-on voltage to a ground voltage after supplying the soft program voltage to the word lines.

13. The method of claim 12, further comprising performing the soft program operation by lowering the first drain turn-on voltage to the second drain turn-on voltage and lowering the second source turn-on voltage to the ground voltage after supplying the soft program voltage to the word lines.

14. The method of claim 9, wherein when dummy lines are included between the drain select line and the word lines and between the source select line and the word lines,
the program pass voltage is supplied to the dummy lines while supplying the program pass voltage to the word lines, and
the soft program voltage is supplied to the dummy lines while supplying the soft program voltage to the word lines.

15. A method of operating a non-volatile memory device, comprising:
erasing a memory cell block;
performing a first program operation by supplying a turn-on voltage to select lines of the memory cell block and supplying a first program voltage to word lines of the memory cell block;
discharging the select lines and the word lines after performing the first program operation; and
performing a second program operation by supplying a turn-on voltage of a target level to the select lines and supplying a second program voltage higher than the first program voltage to word lines adjacent to the respective select lines from among the word lines after the discharging.

16. The method of claim 15, wherein the first and the second program operations are performed at the same time.

17. A method of operating a non-volatile memory device, comprising:
erasing a memory cell block;
supplying a turn-on voltage to select lines of the memory cell block and supplying a program voltage to word lines adjacent to the select lines; and
performing a soft program operation by supplying the program voltage to remaining word lines of the memory cell block.

18. The method of claim 17, wherein the turn-on voltage and the program voltage continue to be supplied to the select lines and the word lines adjacent to the select lines, respectively, while supplying the program voltage to the remaining word lines of the memory cell block.

* * * * *